United States Patent [19]

Tominaga et al.

[11] Patent Number: 5,008,151

[45] Date of Patent: Apr. 16, 1991

[54] GLASS POWDER ADHESIVE SHEET

[75] Inventors: Takashi Tominaga; Souji Nishiyama; Takahumi Sakuramoto; Makoto Honda, all of Osaka, Japan

[73] Assignee: Nitto Denko Corporation, Osaka, Japan

[21] Appl. No.: 231,560

[22] Filed: Aug. 12, 1988

[30] Foreign Application Priority Data

Sep. 11, 1987 [JP] Japan .................... 62-228934

[51] Int. Cl.$^5$ ................................ B32B 7/12
[52] U.S. Cl. ...................... 428/343; 428/440; 428/441; 427/207.1; 427/208.2
[58] Field of Search ............... 428/273, 325, 406, 441, 428/440, 343; 427/207.1, 208.2

[56] References Cited

U.S. PATENT DOCUMENTS

| | | | |
|---|---|---|---|
| 2,267,255 | 12/1941 | Remington et al. | 428/406 |
| 2,646,364 | 6/1953 | Porth | 428/325 |
| 2,970,076 | 1/1961 | Porth | 154/99 |
| 3,293,072 | 12/1966 | Doolittle et al. | 428/430 |
| 3,506,473 | 4/1970 | Ettre et al. | 156/89 |
| 3,514,326 | 5/1970 | Stow | 428/343 |
| 3,574,029 | 4/1970 | Ettre et al. | 156/231 |
| 3,598,679 | 6/1974 | Ettre et al. | 156/249 |
| 3,728,185 | 4/1973 | Gray | 156/89 |
| 4,181,711 | 1/1980 | Ohashi et al. | 428/40 |
| 4,200,681 | 4/1980 | Hall et al. | 428/441 X |
| 4,303,737 | 12/1981 | Litchfield et al. | 428/406 |
| 4,596,841 | 6/1986 | Konishi et al. | 523/410 |
| 4,608,225 | 8/1986 | Sakuramoto et al. | 419/5 |
| 4,681,733 | 7/1987 | Konishi et al. | 419/8 |
| 4,740,416 | 4/1988 | DeCoste, Jr. et al. | 428/325 X |
| 4,761,325 | 8/1988 | Kurihara et al. | 428/325 X |
| 4,780,437 | 10/1988 | Smith | 502/101 |

FOREIGN PATENT DOCUMENTS

| | | | |
|---|---|---|---|
| 119003 | 4/1976 | Japan | 428/441 |
| 2074152 | 3/1981 | United Kingdom . | |

*Primary Examiner*—Merrell C. Cashion, Jr.
*Assistant Examiner*—Stevan A. Resan
*Attorney, Agent, or Firm*—Sughrue, Mion, Zinn, Macpeak & Seas

[57] ABSTRACT

A glass powder adhesive sheet used for a surface coating of inorganic structures comprising ceramics, metals, glasses, etc., a glazed ceramic substrate such as a substrate of electronic circuit, etc. or a heat-resistant label, etc., which comprises a glass powder molding comprising as main components, a glass powder and a resin binder, and an adhesive layer having a thermal decomposition initiation temperature higher than that of the resin binder, provided on the surface of the glass powder molding.

12 Claims, No Drawings

GLASS POWDER ADHESIVE SHEET

FIELD OF THE INVENTION

The present invention relates to a glass powder adhesive sheet which is used for a surface coating of inorganic structures comprising ceramics, metals, glasses and the like, a glazed ceramic substrate such as an electronic circuit board, etc., or a heat-resistant label.

BACKGROUND OF THE INVENTION

Various surface coatings have heretofore been carried out for the purpose of improving characteristics of surface smoothness, abrasion resistance, corrosion resistance, surface hardness and the like, or for the purpose of an appearance decoration.

The surface coating methods include a vacuum evaporation method, sputtering method and the like. However, such methods are disadvantageous in that the equipment is expensive, it is difficult to form a thick coating layer, and so on.

Another method is a screen printing method wherein a paste comprising an inorganic powder and a resin binder as main components is coated and burned. However, the screen printing method has many disadvantages such as the thickness of film formed at a time is limited, the operability is poor, printing on a curved surface is very difficult, and the like.

On the other hand, a glazed ceramic substrate is a ceramic substrate thinly coated with a uniformly molten glass, and is used for a hybrid IC, a thermal printer head, etc. A thin film circuit is formed by forming a thin film on the glazed ceramic substrate by the vacuum evaporation method, sputtering method, etc. and patterning by photolithography. Accordingly, the smoothness of the surface becomes particularly important to improve a pattern accuracy of the circuit.

For the coating of glass on ceramic substrate, it has hitherto been most popular to coat a paste comprising a glass powder and a vehicle by means of the screen printing method.

However, this method has disadvantages that mutiple printings must be carried out because it is difficult to form the necessary coating thickness at a time, the operability is poor, and the accuracy of the coating thickness is poor. A further disadvantage is that surface defects occur because of bubbles entrapped at the time of printing.

In view of the above situation, a method for press-bonding a green sheet comprising a glass powder and a binder as main components to a ceramic substrate was proposed as a method for easily producing a glazed ceramic substrate having excellent thickness accuracy as disclosed in JP-A-61-22682 (the term "JP-A" as used herein means an "unexamined published Japanese patent application"). However, it has a problem that the bonding strength between the green sheet and the ceramic substrate is weak. In order to improve the bonding strength, increasing the amount of the binder added or lowering Tg (glass transition temperature) of the binder was considered. However, problems still arise in that the former tends to form pinholes at burning due to the lowering of the packing density of glass powder and the latter lowers strength of the green sheet, making the sheet difficult to handle. Further, since the green sheet is press-bonded to the ceramic substrate with the binder, another disadvantage is that when the temperature is raised in the subsequent burning step, the bonding strength decreases before the binder disappears, and an edge shrinkage of the glazing part occurs.

To track parts in any production system it is useful to have an identification label having production data on it such as necessary resistances, heat-resistance, resistance to chemicals, etc. This helps to control products, semi-fabricated products, parts, etc. Resistances are particularly necessary for the identification label to control glass products, metal products, sintered ceramic products, etc.

Heretofore, as an identification label which directly sticks to an article to be adhered and has a durability, heat resistance, resistance to chemicals, etc., labels comprising a substrate such as sintered ceramic, stainless steel, enameled ware, etc. have been known. However, such identification labels have involved various disadvantages in that they had to be screwed on, which takes time, they were too inflexible to be affixed to curved surfaces easily, and it was difficult to form a pattern with excellent heat resistance at a job site.

SUMMARY OF THE INVENTION

As a result of extensive investigations to overcome the above problems, it has been found that they can be overcome by preparing a glass powder adhesive sheet according to the present invention which comprises a glass powder molding comprising a glass powder, a resin binder and if necessary, inorganic powder and/or metal powder, and having provided on the surface thereof an adhesive layer having a thermal decomposition initiation temperature higher than that of the resin binder.

DETAILED DESCRIPTION OF THE INVENTION

The present invention is a composition of glass powder, resin binder, and if necessary, an inorganic powder and/or metal powder molded into sheet form in advance. Therefore, the thickness of the coating layer can freely be chosen, a thick film coating layer can be easily formed, and the thickness of the coating layer can be exactly defined. As a result, the apparatus required in the conventional vacuum evaporation method, the sputtering method, and the screen printing method are unnecessary.

Further, lamination of the adhesive sheet can be carried out easily and simply because it is conducted through an adhesive layer. In this case, the heat decomposition initiation temperature of the adhesive is higher than that of the resin binder constituting the powder molding. Thus even if the resin binder in the powder molding decomposes in the burning step, the powder molding still adheres to an article to be coated and does not separate therefrom due to the presence of the adhesive. Consequently, a coating layer having excellent dimensional stability can be formed.

Furthermore, when the glazed ceramic substrate is prepared, the coating thickness can be controlled accurately and easily, unlike that in the conventional printing methods, because the glass powder which was made in sheet-form in advance is laminated to form the glass powder on the ceramic substrate. In addition, bubbles are not entrapped because defoaming can be fully made prior to sheet formation, and the above glass powder molding is laminated simply by laminating the glass powder molding and the ceramic substrate and continuously guiding the laminate into rolling rolls, etc., and this laminating process is far more operable compared with the conventional printing processes and can easily be carried out automatically. Accordingly, an automatic production line of the glazed ceramic substrate can be established by combining this lamination step with the subsequent burning step. In addition, when the glass powder molding is laminated on the ceramic substrate, since the adhesive layer having a thermal decomposition temperature higher than that of the resin binder constituting the glass powder molding is used, the adhesive properties at room temperature also result in an easy lamination, and in the subsequent burning step, shrinkage of the glazed layer edge does not occur due to the fact that the adhesive's properties remain even after the resin binder constituting the glass powder molding is decomposed.

When the powder adhesive sheet of the present invention is used as an identification label, the identification label is obtained by temporarily attaching the above sheet or piece processed into a desired label shape, to a surface having a low adhesiveness base material or release material. This is prepared by coating the surface of the base material such as polyester film and kraft paper having a self-supporting property with a low adhesiveness compound such as silicone type resins and then forming the pattern of letters, figures or barcode on the sheet with an ink (e.g., JP-A-58-43486) which is different from a ground-color of the label for burning. In this case, since the adhesive layer has a thermal decomposition initiation temperature higher than that of the resin binder, even if the resin binder decomposes in the subsequent burning step after the identification label is stuck to the article to be labeled adhesive properties are still maintained and the label will not slip out of place or blister.

When the glass powder adhesive sheet of the present invention is used as an identification label, the embodiment in which a pattern with ink for burning is carried out after the label is stuck to the article, or the identification mark is made without using ink for burning but by using a difference of label shapes, shaping holes or uneven surface on the label, or sorting with label colors or colors of the article to be adhered and the label, are included in the present invention.

The glass powders used in the present invention are conventional $PbO-B_2O_3-SiO_2$ system, Pb-free $Na_2O-B_2O_3SiO_2$ system and $BaO-CaO-SiO_2$ system colorless glasses, etc., and $PbO-SiO_2-B_2O_3-Al_2O_3-SnO_2$ system colored glasses having a softening point of 300° to 1400° C. and a particle size of 0.1 to 100 $\mu$m, preferably 0.5 to 30 $\mu$m.

Examples of the resin binder include synthetic polymers such as hydrocarbon resins, vinyl resin, acetal resin, acrylic resin, styrene resin, polyester resin, polyurethane resin, etc. or semisynthetic polymers such as cellulose resin, etc. Of these, the hydrocarbon resins, acrylic resin, acetal resin and cellulose resin are preferred from the standpoint of easy thermal decomposition, and the acrylic resin is particularly preferred.

The resin binder having a thermal decomposition initiation temperature of 100° to 350° C. and a thermal decomposition termination temperature of 250° to 700° C. is selected, and the amount added thereof varies depending upon a specific gravity and a particle size of the glass powder and the optionally added inorganic powder and/or metal powder, but the amount of 5 to 100 parts by weight per 100 parts by weight of the glass powder is preferred. As is well known in the art, if the amount of resin binder used is relatively large, degassing is insufficient, resulting in foaming, and if the amount of resin binder used is relatively small, the strength of the powder molding decreases and the operability deteriorates markedly.

The inorganic powder and/or metal powder are mainly used to improve surface characteristics in the case of the surface coating or glazed ceramic substrate, but in the case where the glass powder adhesive sheet is used as an identification label, it functions as a coloring agent which contrasts with the color of the ink for burning or the article to be colored, besides the improvement of surface characteristics. The particle size of the powder is usually about 0.05 to 50 $\mu$m, preferably about 0.5 to 20 $\mu$m. The amount used thereof is about 1 to 50 parts by weight per 100 parts by weight of the glass powder.

Examples of the inorganic powder are $SiC$, $Si_3N_4$, $BN$, $Al_2O_3$, $ZnO_2$, $SiO_2$, $TiO_2$, $BaTiO_3$, $MnO_2$, $Cr_2O_3$, $NiO_2$, $CoO$, $Fe_2O_3$, $Fe_3O_4$, etc., which can be used alone or mixtures thereof.

Examples of the metal powder are iron, chrome, copper, silver, gold, etc., which can be used alone or mixtures thereof.

In order to improve a uniform mixability of the glass powder, and inorganic powder and/or metal powder with the resin binder, a dispersing agent can also be used. Examples of the dispersing agent are various conventional surface active agents and the other aliphatic acid, aliphatic acid ester, fish oil, acrylic oligomer, etc. The amount of the dispersing agent used in this case is 0.01 to 10 parts by weight, preferably 0.1 to 2 parts by weight, per 100 parts by weight of sum of the glass powder and inorganic powder and/or metal powder.

When the powder molding is prepared, appropriate additives such as a solvent, a defoaming agent, etc. can be added to prepare a sheet-like molding by conventional doctor blade method, etc. That is, the powder molding having a good accuracy of thickness can be obtained by mixing a glass powder, a resin binder, a solvent, and, if necessary, inorganic powder and/or metal powder, a dispersing agent, a release agent, etc. in a ball mill and then casting the mixture with a doctor blade. Further, the bubbles in the sheet-like molding can be removed by sufficiently degassing a slurry before the casting. When this powder molding is prepared, an appropriate base film can be used to be the slurry casted thereon. The base film used in this case has a function to reinforce the powder molding and disappears in the subsequent burning step. Various synthetic resin films can be used as such a base film.

The adhesive layer is formed on the surface of the sheet-like glass powder molding (in the event that the molding is prepared by casting on a base film, on the surface having no film formation) by spraying, brushing or transferring the adhesive layer which has been previously formed on a low adhesiveness substrate, or directly coating on an adhesive.

The material constituting the adhesive layer can be any material having adhesive properties at room temperature or materials exhibiting adhesive properties after activation by external factors such as heat, water, solvent or the like if the material has a thermal decomposition initiation temperature of 100° to 350° C. and thermal decomposition termination temperature of 250° to 750° C. Examples of the materials include polyethylene, ethylene copolymer, ethylene-propylene rubber, polyisobutylene, hydrocarbon resins such as petroleum resin, terpene resin, etc., acrylic resins such as polyacrylic ester, polymethacrylic ester, polyacrylamide, etc., diene resins such as polybutadiene, polyisoprene, etc., vinyl acetate, polyvinyl acetal resins, polyether resins, polyester resins, polyurethane resins, cellulose resins and the like. However, it is preferred from a standpoint of good operability to use materials having pressure-sensitive adhesive properties at room temperature such as acrylic pressure-sensitive adhesives comprising a copolymer of (metha)acrylic acid ester and a vinyl monomer having a functional group copolymerizable with the ester; resin pressure-sensitive adhesives such as polyvinyl ether pressure-sensitive adhesive, etc.; or rubber pressure-sensitive adhesives such as neoprene rubber pressure-sensitive adhesive, isoprene pressure-sensitive adhesive, etc., alone or in combination with a hot-melt resin to decrease the adhesive properties.

In the combination of the adhesive with the above-described resin binder, it is necessary to combine in the manner such that the thermal decomposition initiation temperature of the adhesive becomes higher than that of the binder from the standpoints of dimensional stability and prevention of slipping out of position of the glass powder molding in the burning step. It is more desirable that the thermal decomposition initiation temperature difference should be at least 10° C., preferably 15° C.

The glass powder adhesive sheet thus prepared is adhered on a substance such as ceramic, glass, metal, etc. which is heat-resistant and does not deteriorate when heated in the burning step when the object is a surface coating; the sheet is adhered through the adhesive layer on a ceramic substrate such as alumina, beryllia, steatite, forsterite, zirconia, etc. when the object is to prepare the glazed ceramic substrate; and the glass powder adhesive sheet which is processed to be label-like and printed with an ink for burning, is stuck through the adhesive layer on an article when the object is the identification label.

The glass powder adhesive sheet stuck on the heat-resistant substance, ceramic substrate or object is heated up to a temperature higher than the softening point of the glass powder (usually 350 to 1,400° C.) at a temperature raising rate of 5° to 30° C./min, whereby the resin binder is first decomposed and the adhesive layer is then decomposed with complete burning.

The glass powder adhesive sheet of the present invention enables structures made of ceramics, glass, metal, etc. to improve their characteristics such as surface smoothness, wear resistance, corrosion resistance, surface hardness, etc. when used as a surface coating material, and can be utilized for various parts such as electrical and electronic parts, automobile parts, mechanical parts, etc.

In the case of preparation of the glazed ceramic substrate, the thickness can be accurately controlled by making a sheet-form in advance, and the defoaming can easily be carried out in advance before making a sheet-form. The adhesive properties are also excellent because the sheet is press-bonded to the substrate with the adhesive layer. Further, since the thermal decomposition initiation temperature of the adhesive layer is higher than that of the resin binder used for the glass powder molding, there are the following advantages in the subsequent burning step. Firstly, the resin binder in the glass powder molding has already decomposed to some extent at a temperature at which the adhesive begins to decompose by heat, and the glass powder molding is in a state having a gas permeability. Accordingly, since a decomposition gas generated by the thermal decomposition of the adhesive can easily pass through the glass powder molding, no results during the glass powder molding in the burning step, and a good smoothness and a good appearance can be obtained even after the burning step. Secondly, at a temperature at which the decomposition of the adhesive results in loss of adhesive strength, the glass powder molding becomes powdery, and as a result, a shift of warpage, shrinkage, etc. in the layer of the glass powder molding arising when the resin binder remains therein, can be prevented. Accordingly, due to good adhesion between the glass powder and the substrate, shrinkage of the glazed layer can be prevented.

When the glass powder adhesive sheet of the present invention is used as an identification label, since the sheet can be adhered to an article in the unburned state, the sheet can also be easily adhered to a curved surface, and a product having an excellent durability, heat resistance and resistance to chemicals can be obtained. Further, since the thermal decomposition initiation temperature of the adhesive layer is higher than that of the organic resin binder, a slipping out of position and blistering during the burning step do not take place.

The glass powder adhesive sheet can also be used for electronic parts such as circuit pattern, etc.

The present invention is now illustrated in detail by reference to the Examples and Comparative Examples, but it should be understood that the present invention is not deemed to be limited thereto. In these examples, all the parts are by weight.

EXAMPLE 1

$SiO_2$-CaO-BaO system glass powder having an average particle size of 11 μm was prepared.

100 Parts of the glass powder, 15 parts of a copolymer of butyl acrylate, methyl methacrylate and methacrylamide (60:35:5, thermal decomposition initiation temperature: 160° C., thermal decomposition termination temperature: 560° C.), 1 part of oleic acid as a dispersing agent, 24 parts of toluene and 16 parts of methyl ethyl ketone were mixed in a ball mill at room temperature, and the mixture was cast on a polyester film (thickness: 75 μm) using a doctor blade to obtain a powder sheet having a thickness of 100 μm. A 10 μm thick pressure-sensitive adhesive mainly composed of 2-ethylhexyl acrylate copolymer was laminated thereon. The composition of the pressure-sensitive adhesive was a mixture of butyl acrylate and acrylic acid (100:5) and had a thermal decomposition initiation temperature of 250° C. and a thermal decomposition termination temperature of 590° C.

The above powder sheet coated with the adhesive was affixed to a ceramic molding comprising silicon nitride, and after binder-removal at 400° C. for 30 minutes, the temperature of the ceramic molding was raised at the rate of 20° C./min. The temperature was maintained at 1000° C. for 10 minutes to conduct burning. Upon measuring the thickness of the surface coated layer of the molding thus obtained, it was found that the layer had a good thickness accuracy of 65±2 μm and the surface smoothness was very good.

EXAMPLE 2

90 Parts of $PbO-B_2O_3$ system glass as a glass powder which contains 80 wt% of PbO and has an average particle size of 25 μm, 10 parts of alumina powder having an average particle size of 25 μm. 10 parts of isobutyl methacrylate as a resin binder having a thermal decomposition initiation temperature of 140° C. and a thermal decomposition termination temperature of 340° C., 1 part of lauric acid as a dispersing agent and 35 parts of toluene as a plasticizer were mixed in a ball mill at room temperature, and the mixture was cast on a polyester film (thickness: 75 μm) using an applicator to obtain a powder sheet having a thickness of 80 μm. A 10 μm thick pressure-sensitive adhesive mainly composed of isoprene rubber was laminated on the powder sheet to obtain a powder tape sheet. The pressure-sensitive adhesive had a thermal decomposition initiation temperature of 200° C. and a thermal decomposition termination temperature of 520° C.

The above powder tape sheet was affixed to a $LiO_2$-$Al_2O_3$-$SiO_2$ system heat-resistant glass molding and the temperature of the glass molding was raised at the rate of 10° C./min. to burn it at 500° C. for 10 minutes. A thickness accuracy of the surface coated layer thus obtained was good and there was no appearance troubles such as foaming, blistering, etc.

EXAMPLE 3

A glazed ceramic substrate was prepared by the following method using a resin binder and a pressure-sensitive adhesive as shown in Table 1 below.

$CaO$-$BaO$-$SiO_2$ system glass having a softening point of 850° C. and an average particle size of 11 μm was used as a glass powder.

100 Parts of the glass powder, 12 parts of a resin binder, 1 part of oleic acid as a dispersing agent, 24 parts of toluene and 16 parts of methyl ethyl ketone were mixed in a ball mill at room temperature, and the mixture was cast on a polyester film using a doctor blade to obtain a glass powder sheet having a thickness of 130 μm. A 20 μm thick pressure-sensitive adhesive was laminated on the above glass powder sheet. An alumina substrate having a purity of 96.0% was used as a ceramic substrate. The glass powder sheet laminated with the adhesive was press-bonded on the alumina substrate. After binder-removal of the laminated sheet at 400° C. for 60 minutes, the temperature of the alumina substrate was raised at the rate of 10° C./min. to burn it at 1270° C. for 120 minutes, whereby the glazing was accomplished.

An appearance of the substrate thus obtained and an edge shrinkage were visually measured. The results are as shown in Table 1.

TABLE 1

| | Resin binder | | Pressure sensitive adhesive | | |
|---|---|---|---|---|---|
| | Type | Thermal decomposition initiation temperature (°C.) | Type | Thermal decomposition initiation temperature (°C.) | Measurement result |
| Example 3 | Acrylic[1] type A | 160 | Acrylic[2] type B | 180 | Good |
| Comparative Example 1 | Acrylic type A | 160 | Acrylic[3] type C | 140 | Pinhole was found |
| Comparative Example 2 | Acrylic[4] type E | 190 | Acrylic type B | 180 | Edge shrinkage was found |

Notes:
[1] Acrylic type A; Butyl acrylate/methyl methacrylate copolymer. (Thermal decomposition termination temperature: 560° C.)
[2] Acrylic type B; A mixture of butyl acrylate/acrylic acid copolymer and a terpene phenol resin. (Thermal decomposition termination temperature: 635° C.)
[3] Acrylic type C; 2-Ethylhexy acrylate/acrylic acid/methacrylic acid/glycidyl methacrylate copolymer (Thermal decomposition termination temperature: 470° C.)
[4] Acrylic type E; A mixture of butyl acrylate/acrylic acid copolymer and phenolic resin. (Thermal decomposition termination temperature: 650° C.)

COMPARATIVE EXAMPLES 1 TO 2

Example 3 was followed except for using the components shown in Table 1 above. The results are also shown in Table 1.

From the results shown in the above Table 1, it is found that the glazed ceramic substrate having a good appearance, a good surface smoothness and no edge shrinkage can be obtianed only when the laminating was carried out using the pressure-sensitive adhesive having a thermal decomposition initiation temperature higher than that of the resin binder constituting the glass powder sheet.

EXAMPLE 4

To 85 parts of $PbO$-$B_2O_3$-$SiO_2$ system glass powder having an average particle size of 11 μm and 15 parts of $ZrO_2$ powder, were added 20 parts of isobutyl acrylate having a thermal decomposition initiation temperature of 140° C. and a thermal decomposition termination temperature of 340° C., 1 part of lauric acid and 42 parts of toluene as a dispersing agent, and the mixture was uniformly mixed in a ball mill at room temperature. The mixture was coated on a polyester film (thickness: 75 μm) using a doctor blade to obtain a powder sheet having a thickness of 60 μm.

A butyl acrylate/acrylic acid copolymer (Thermal decomposition initiation temperature: 250° C., Thermal decomposition termination temperature: 590° C.) was laminated in a thickness of 20 μm on the opposite surface of the powder sheet film.

On the other hand, 30 parts of the above glass powder, 20 parts of chrome composition black pigment, 50 parts of butyl acrylate and 100 parts of toluene were uniformly mixed to prepare an ink for burning. Barcode printing was made on a label material produced by processing the above glass powder adhesive sheet, by means of a screen printer using the ink for burning.

The identification label thus printed was adhered on the glass powder molding and the temperature of the molding was raised at the rate of 10° C./min. to burn it at 540° C. for 30 minutes. The product showed the black bar-code clearly on a whitish ground and also showed no foaming, slipping out of position or crazing.

While the invention has been described in detail and with reference to specific embodiment thereof, it will be apparent to one skilled in the art that various changes and modifications can be made therein without departing from the spirit and scope thereof.

What is claimed is:

1. A multilayer glass powder adhesive sheet comprising:
   a glass powder molding layer consisting essentially of glass powder and a resin binder; and
   an adhesive layer having a thermal decomposition initiation temperature higher than that of said resin binder, provided on the surface of the glass powder molding layer wherein the difference between the thermal decomposition initiation temperature of said adhesive layer and that of said resin binder is at least 10° C.

2. A glass powder adhesive sheet as claimed in claim 1, wherein the glass powder has a softening point of 300° to 1400° C.

3. A glass powder adhesive sheet as claimed in claim 1, wherein the resin binder has a thermal decomposition initiation temperature of 100° to 350° C.

4. A glass powder adhesive sheet as claimed in claim 1, wherein the adhesive layer has a thermal decomposition initiation temperature of 100° to 350° C.

5. A glass powder adhesive sheet as claimed in claim 1, wherein the adhesive layer exhibits adhesive properties after activation by heat, water, solvent, or pressure.

6. A glass powder adhesive sheet as claimed in claim 1, wherein a release substrate having a self-supporting property is temporarily provided on the surface of the adhesive layer.

7. A glass powder adhesive sheet as claimed in claim 1, wherein the glass powder molding further comprises at least one powder selected from the group consisting of an inorganic powder and a metal powder.

8. A glass powder adhesive sheet as claimed in claim 7, wherein the glass powder has a softening point of 300° to 1400° C.

9. A glass powder adhesive sheet as claimed in claim 7, wherein the resin binder has a thermal decomposition initiation temperature of 100° to 350° C.

10. A glass powder adhesive sheet as claimed in claim 7, wherein the adhesive layer has a thermal decomposition initiation temperature of 100° to 350° C.

11. A glass powder adhesive sheet as claimed in claim 7, wherein the adhesive layer exhibits adhesive properties after activation by heat, water, solvent, or pressure.

12. A glass powder adhesive sheet as claimed in claim 7, wherein a release substrate having a self-supporting property is temporarily provided on the surface of the adhesive layer.

* * * * *